(12) United States Patent
Ramakrishnan et al.

(10) Patent No.: US 12,108,568 B2
(45) Date of Patent: Oct. 1, 2024

(54) SYSTEMS AND METHODS FOR THERMAL MANAGEMENT OF HIGH-CAPACITY DEVICES IN IMMERSION-COOLED DATACENTERS

(71) Applicant: Microsoft Technology Licensing, LLC, Redmond, WA (US)

(72) Inventors: Bharath Ramakrishnan, Bellevue, WA (US); Husam Atallah Alissa, Redmond, WA (US); Eric C. Peterson, Woodinville, WA (US); Nicholas Andrew Keehn, Kirkland, WA (US); Christian L. Belady, Mercer Island, WA (US); Ioannis Manousakis, Redmond, WA (US); Dennis Trieu, Calgary (CA)

(73) Assignee: Microsoft Technology Licensing, LLC, Redmond, WA (US)

( * ) Notice: Subject to any disclaimer, the term of this patent is extended or adjusted under 35 U.S.C. 154(b) by 188 days.

(21) Appl. No.: 17/525,536

(22) Filed: Nov. 12, 2021

(65) Prior Publication Data
US 2023/0156960 A1 May 18, 2023

(51) Int. Cl.
H05K 7/20 (2006.01)

(52) U.S. Cl.
CPC ......... H05K 7/203 (2013.01); H05K 7/20236 (2013.01); H05K 7/20327 (2013.01); H05K 7/20381 (2013.01); H05K 7/20781 (2013.01); H05K 7/20818 (2013.01)

(58) Field of Classification Search
CPC ............... H05K 7/203; H05K 7/20236; H05K 7/20818; H05K 7/20836; H05K 7/20318; H05K 7/20327; H05K 7/208; H05K 7/20281; H05K 7/20272; H05K 7/20936; G06F 2200/201; G06F 1/20; G06F 1/206; H01L 23/44; H01L 23/473
USPC ...................................................... 361/679.53
See application file for complete search history.

(56) References Cited

U.S. PATENT DOCUMENTS

| 7,450,378 B2 * | 11/2008 | Nelson ................ H01L 23/4735 361/689 |
| 7,724,524 B1 | 5/2010 | Campbell et al. |
| 10,045,466 B1 | 8/2018 | Chen et al. |
| 10,238,011 B1 | 3/2019 | Cui et al. |

(Continued)

FOREIGN PATENT DOCUMENTS

| CN | 111010851 A | 4/2020 | |
| EP | 1380799 A2 * | 1/2004 | ............ F25B 23/006 |
| WO | 2021099768 A1 | 5/2021 | |

OTHER PUBLICATIONS

"International Search Report and Written Opinion Issued in PCT Application No. PCT/US22/047962", Mailed Date: Mar. 6, 2023, 12 Pages.

*Primary Examiner* — Mandeep S Buttar
(74) *Attorney, Agent, or Firm* — RAY QUINNEY & NEBEKER P.C.; Paul N. Taylor

(57) ABSTRACT

A method of thermal management of a computing device includes immersing a first electronic component of the computing device in a first working fluid contained in a first volume, immersing a second electronic component of the computing device in a second working fluid contained in a second volume, and changing a pressure in the first volume to alter a boiling temperature of the first working fluid in the first volume.

20 Claims, 5 Drawing Sheets

(56) References Cited

U.S. PATENT DOCUMENTS

| | | | |
|---|---|---|---|
| 2009/0260777 A1* | 10/2009 | Attlesey | H01L 23/473 |
| | | | 165/104.33 |
| 2010/0226094 A1* | 9/2010 | Attlesey | H05K 7/20772 |
| | | | 361/699 |
| 2010/0328889 A1 | 12/2010 | Campbell et al. | |
| 2011/0063792 A1 | 3/2011 | Schmidt et al. | |
| 2011/0315353 A1 | 12/2011 | Campbell et al. | |
| 2013/0081790 A1* | 4/2013 | Tufty | F28D 1/02 |
| | | | 165/104.33 |
| 2014/0123493 A1* | 5/2014 | Campbell | F28F 3/12 |
| | | | 29/890.03 |
| 2014/0262180 A1* | 9/2014 | Lyon | F28F 9/02 |
| | | | 165/173 |
| 2015/0060009 A1* | 3/2015 | Shelnutt | H05K 7/203 |
| | | | 165/11.1 |
| 2016/0113149 A1 | 4/2016 | Krug et al. | |
| 2018/0246550 A1 | 8/2018 | Inaba et al. | |
| 2018/0255661 A1 | 9/2018 | Helsel et al. | |
| 2019/0166725 A1* | 5/2019 | Jing | H05K 7/20327 |
| 2019/0223324 A1* | 7/2019 | Le | H05K 7/20263 |
| 2020/0089293 A1 | 3/2020 | Enright et al. | |
| 2021/0185850 A1 | 6/2021 | Kulkarni et al. | |
| 2021/0307208 A1* | 9/2021 | Shao | H05K 7/20781 |
| 2022/0239198 A1* | 7/2022 | Dogruoz | G06F 1/20 |
| 2022/0264768 A1* | 8/2022 | Horng | H05K 7/20327 |
| 2022/0322572 A1* | 10/2022 | Chehade | G06F 1/20 |

* cited by examiner

SYSTEMS AND METHODS FOR THERMAL MANAGEMENT OF HIGH-CAPACITY DEVICES IN IMMERSION-COOLED DATACENTERS

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Different computing components produce different amounts of thermal energy and require different amounts of thermal management. Conventional thermal management systems cool the entire device uniformly, which may insufficiently cool the high-capacity components and/or waste energy cooling components that may not need the thermal management.

BRIEF SUMMARY

In some embodiments, a method of thermal management of a computing device includes immersing a first electronic component of the computing device in a first working fluid contained in a first volume, immersing a second electronic component of the computing device in a second working fluid contained in a second volume, and changing a pressure in the first volume to alter a boiling temperature of the first working fluid in the first volume.

In some embodiments, a system for immersion cooling of a server computer includes an immersion tank, a server computer positioned in the immersion tank, a component tank positioned on a high-capacity component of the server computer, a first working fluid in the component tank, and a second working fluid in the immersion tank. The first working fluid contacts the high-capacity component in the component tank, and the second working fluid contacts a heat-generating component of the server computer outside of the component tank.

In some embodiments, a system for immersion cooling of a server computer includes an immersion tank, a first server computer positioned in the immersion tank, a second server computer positioned in the immersion tank, and a liquid working fluid in the immersion tank. The first server computer includes at least one first heat-generating component and at least one first high-capacity component, a first component tank positioned around the at least one first high-capacity component, and a first component working fluid positioned in the first component tank and contacting the at least one first high-capacity component. The first component working fluid has a first component fluid pressure. The second server computer includes at least one second heat-generating component and at least one second high-capacity component, a second component tank positioned around the at least one second high-capacity component, and a second component working fluid positioned in the second component tank and contacting the at least one second high-capacity component. The second component working fluid has a second component fluid pressure. The liquid working fluid positioned in the immersion tank contacts the first heat-generating components of the first server computer and the second heat-generating components of the second server computer. The liquid working fluid in the immersion tank has a fluid pressure different than the first component fluid pressure or the second component fluid pressure.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 3-1 is a side schematic representation of a single-phase immersion cooling system with an on-component cooling loop with two-phase immersion cooling, according to at least one embodiment of the present disclosure;

FIG. 3-2 is a flowchart illustrating an embodiment of a method of thermal management using the immersion cooling system of FIG. 3-1, according to at least one embodiment of the present disclosure;

DETAILED DESCRIPTION

The present disclosure relates generally to systems and methods for thermal management of electronic devices or other heat-generating components Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the hot working fluid can be circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of boiling.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a heat exchanger to cool the liquid phase and/or a condenser to extract heat from the vapor phase of the working fluid. The heat exchanger may include a condenser that condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid.

Whether the immersion cooling system is a two-phase cooling system (wherein the working fluid vaporizes and condenses in a cycle) or a one-phase cooling system (wherein the working fluid remains in a single phase in a cycle), the heat transported from the heat-generating components outside of the immersion chamber is further exchanged with an ambient fluid to exhaust the heat from the system.

Figure 1:
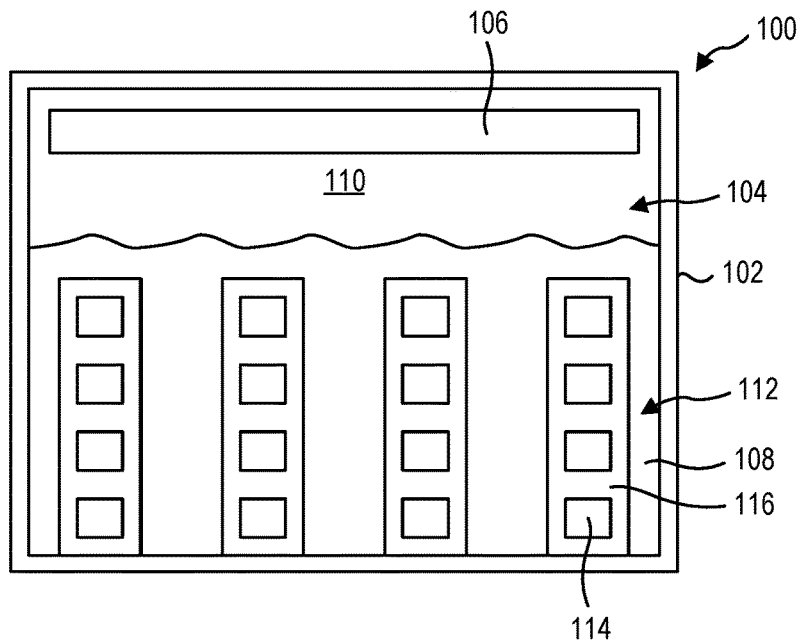
FIG. 1 is a side schematic representation of an immersion cooling system, according to at least one embodiment of the present disclosure.

A conventional immersion cooling system 100, shown in FIG. 1, includes an immersion tank 102 containing an immersion chamber 104 and a condenser 106 in the immersion chamber 104. The immersion chamber 104 contains a working fluid that has a liquid working fluid 108 and a vapor working fluid 110 portion. The liquid working fluid 108 creates an immersion bath 112 in which a plurality of heat-generating components 114 are positioned to heat the liquid working fluid 108 on supports 116.

Figure 2:
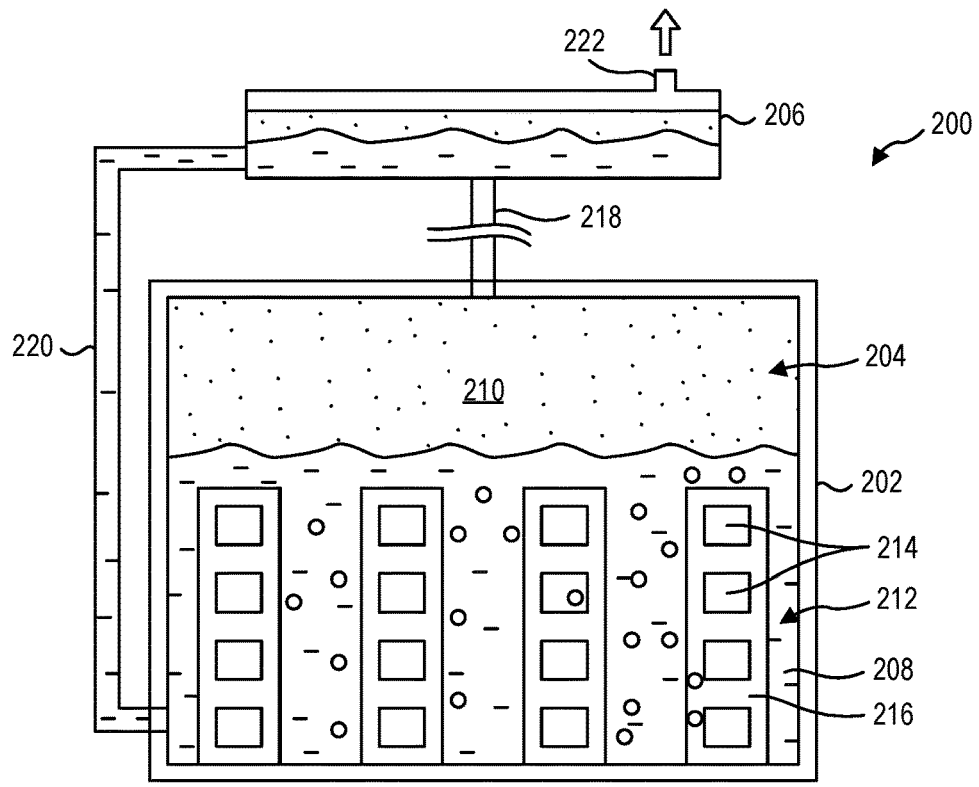
FIG. 2 is a side schematic representation of an immersion cooling system with an external condenser, according to at least one embodiment of the present disclosure.

Referring now to FIG. 2, an immersion cooling system 200 according to the present disclosure includes an immersion tank 202 defining an immersion chamber 204 with a working fluid positioned therein. The working fluid transitions between a liquid working fluid 208 phase and a vapor working fluid 210 phase to remove heat from hot or heat-generating components 214 in the immersion chamber 204. The liquid working fluid 208 more efficiency receives heat from the heat-generating components 214 and, upon transition to the vapor working fluid 210, the vapor working fluid 210 can be removed from the immersion tank 202, cooled and condensed by the condenser 206 (or other heat exchanger) to extract the heat from the working fluid, and the liquid working fluid 208 can be returned to the liquid immersion bath 212.

In some embodiments, the immersion bath 212 of the liquid working fluid 208 has a plurality of heat-generating components 214 positioned in the liquid working fluid 208. The liquid working fluid 208 surrounds at least a portion of the heat-generating components 214 and other objects or parts attached to the heat-generating components 214. In some embodiments, the heat-generating components 214 are positioned in the liquid working fluid 208 on one or more supports 216. The support 216 may support one or more heat-generating components 214 in the liquid working fluid 208 and allow the working fluid to move around the heat-generating components 214. In some embodiments, the support 216 is thermally conductive to conduct heat from the heat-generating components 214. The support(s) 216 may increase the effective surface area from which the liquid working fluid 208 may remove heat through convective cooling.

In some embodiments, the heat-generating components 214 include electronic or computing components or power supplies. In some embodiments, the heat-generating components 214 include computer devices, such as individual personal computer or server blade computers. In some embodiments, one or more of the heat-generating components 214 includes a heat sink or other device attached to the heat-generating component 214 to conduct away thermal energy and effectively increase the surface area of the heat-generating component 214. In some embodiments, the heat-generating components 214 include an electric motor.

As described, conversion of the liquid working fluid 208 to a vapor phase requires the input of thermal energy to overcome the latent heat of vaporization and may be an effective mechanism to increase the thermal capacity of the working fluid and remove heat from the heat-generating components. Because the vapor working fluid 210 rises in the liquid working fluid 208, the vapor working fluid 210 can be extracted from the immersion chamber 204 in an upper vapor region of the chamber. A condenser 206 cools part of the vapor working fluid 210 back into a liquid working fluid 208, removing thermal energy from the system and reintroducing the working fluid into the immersion bath 212 of the liquid working fluid 208. The condenser 206 radiates or otherwise dumps the thermal energy from the working fluid into the ambient environment or into a conduit to carry the thermal energy away from the cooling system.

In conventional immersion cooling systems, a liquid-cooled condenser is integrated into the immersion tank and/or the chamber to efficiency remove the thermal energy from the working fluid. In some embodiments according to the present disclosure, an immersion cooling system 200 for thermal management of computing devices allows at least one immersion tank 202 and/or chamber 204 to be connected to and in fluid communication with an external condenser 206. In some embodiments, an immersion cooling system includes a vapor return line 218 that connects the immersion tank 202 to the condenser 206 and allows vapor working fluid 210 to enter the condenser 206 from the immersion tank 202 and/or chamber 204 and a liquid return line 220 that connects the immersion tank 202 to the condenser 206 and allows liquid working fluid 208 to return to the immersion tank 202 and/or chamber 204.

The vapor return line 218 may be colder than the boiling temperature of the working fluid. In some embodiments, a portion of the vapor working fluid 210 condenses in the vapor return line 218. The vapor return line 218 can, in some embodiments, be oriented at an angle such that the vapor return line 218 is non-perpendicular to the direction of gravity. The condensed working fluid can then drain either back to the immersion tank 202 or forward to the condenser 206 depending on the direction of the vapor return line 218 slope. In some embodiments, the vapor return line 218 includes a liquid collection line or valve, like a bleeder valve, that allows the collection and/or return of the condensed working fluid to the immersion tank 202 or condenser 206.

In some examples, an immersion cooling system 200 includes an air-cooled condenser 206. An air-cooled condenser 206 may require fans or pumps to force ambient air over one or more heat pipes or fins to conduct heat from the condenser to the air.

Figures 1, 3:
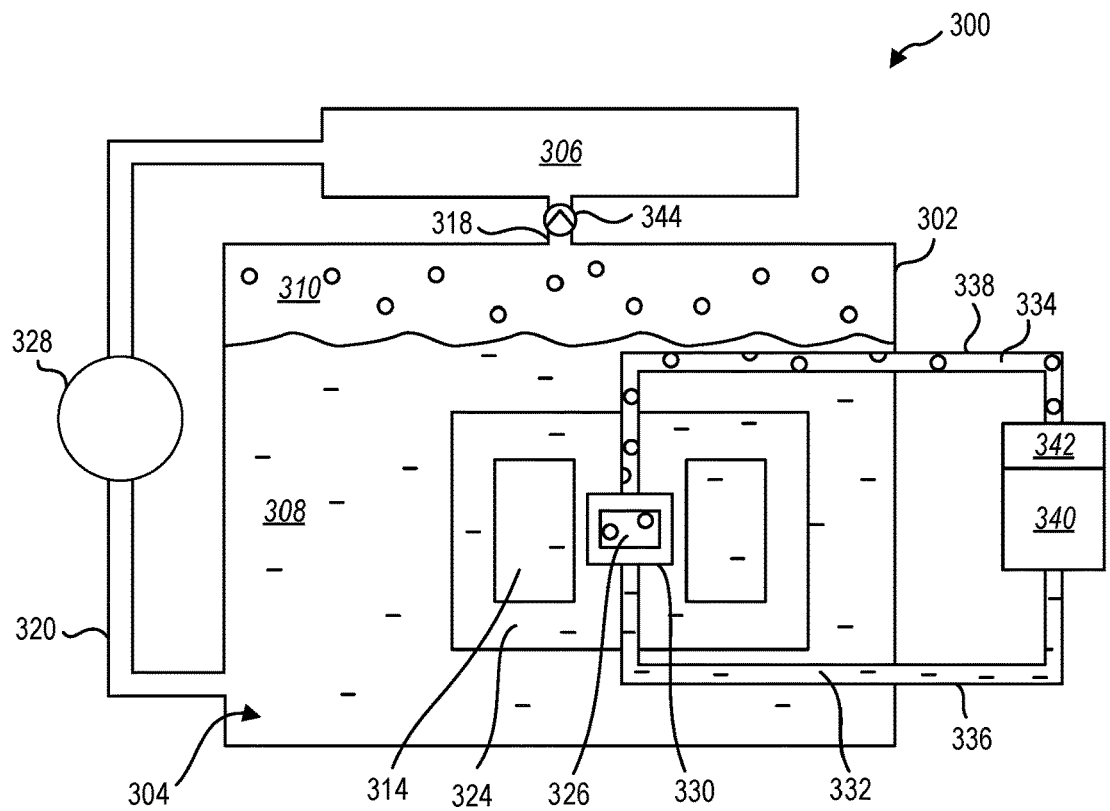
Figures 2, 3:
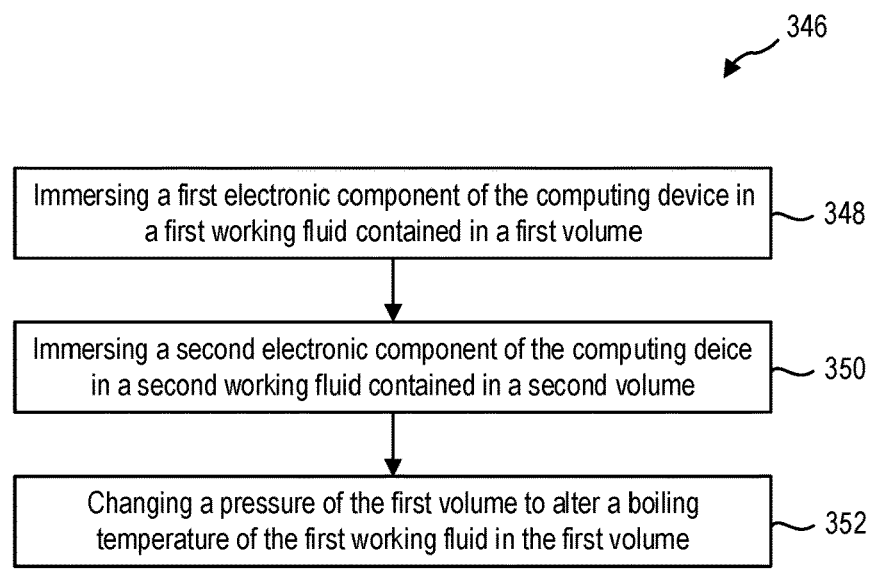

FIG. 3-1 is a schematic representation of an immersion cooling system 300 with two different volumes of working fluid for cooling different components of a computing device. In some embodiments, a server computer 324 or other computing device is positioned inside an immersion tank 302 for cooling. The immersion tank 302 houses a working fluid that cools the server computer 324 by absorbing heat from the components of the server computer 324. The liquid working fluid 308 may vaporize into vapor working fluid 310 which rises in the tank 302 toward a condenser 306.

In some embodiments, the immersion cooling system 300 includes on-component cooling that includes a separate volume of working fluid to cool the high-capacity components 326 of the server computer 324, such as a CPU, GPU, or other components that generate large amounts of heat. Other heat-generating components 314 on the server computer 324 may be cooled by the liquid working fluid 308 in the immersion tank 302, generally.

The immersion cooling system 300 includes a vapor return line 318 to the condenser 306 and a liquid return line 320 from the condenser 306 to the immersion chamber 304 of the immersion tank 302. The condenser 306 rejects heat to the ambient atmosphere to remove heat from the system and return the cooled liquid working fluid 308 to the immersion chamber 304 to continue cooling the heat-generating components 314. A tank pump 328 may be positioned in the vapor return line 318 or liquid return line 320 to circulate the working fluid.

The on-component cooling volume includes a component tank 330 positioned on the high-capacity component 326 to hold a liquid component working fluid 332 around and/or in contact with a surface of the high-capacity component 326. The high-capacity component 326 may heat or vaporize the liquid component working fluid 332 and convert the liquid component working fluid 332 to vapor component working fluid 334. The liquid component working fluid 332 may be delivered to the component tank 330 by a component liquid return line 336 and the vapor component working fluid 334 carries away heat from the high-capacity component 326 through a component vapor return line 338. The component vapor return line 338 directs the vapor component working fluid 334 to a component condenser 340 that condenses the vapor component working fluid 334 back to a liquid component working fluid 332 and rejects the heat to the ambient atmosphere. In at least one example, the working fluid in the immersion tank 302 and the component working fluid in the component cooling loop are the same working fluid. Using the same working fluid may simplify maintenance by only requiring the stocking and maintenance of a single fluid and/or simplify repairs by ensuring that leaks of a first working fluid in one volume do not contaminate the second working fluid in the other volume. However, using a single working fluid results in a working fluid with a single boiling temperature, despite the components of the server computer 324 (e.g., the heat-generating components 314 and high-capacity components 326) operating at different temperatures.

Because the working fluid can carry away heat most efficiently by absorbing heat through the latent heat of boiling, the working fluid may work most efficiently when the boiling temperature of the working fluid is at or near the operating temperature of the components being cooled. In other examples, it may be desirable to prevent boiling, as the liquid working fluid 308 may expand by 100 times or more upon vaporization into vapor working fluid 310. Unintended or undesirable vaporization may cause an increase in pressure that may damage the immersion cooling system 300. Rapid vaporization can cause a dryout effect when the surface of a heat-generating component 314 vaporizes the liquid cooling fluid 308 so rapidly that an insufficient mass of liquid working fluid 308 contacts the surface of the heat-generating component 314, which compromises the convective cooling on the surface of the heat-generating component 314 and allows the temperature thereof to increase too quickly.

Additionally, working fluid is recycled through the volumes of the thermal management system, and, in some embodiments, the working fluid is a dielectric fluid or other fluid that is expensive. A thermal management system that uses less working fluid and/or uses the working fluid more efficiently allows for cost savings in the working fluid. In some embodiments, the working fluid is relatively dense and containing large volumes of the working fluid requires a strong container. Building and maintaining containers for large volumes and/or masses of working fluid can increase construction costs and container weight, which limits transport and maintenance of the containers.

In a conventional immersion tank, the liquid pressure increases as depth of the immersion bath increases. In conventional tanks and fluids, a depth of 1 meter results in a 2.3 pounds per square inch (PSI) increase. The increased pressure results in an increase in the boiling point for the working fluid and a resulting temperature increase of the components adjacent the working fluid at the bottom of the immersion bath. When separate immersion chambers are placed around heat-generating components, and/or the boards are oriented horizontally, the columnar pressure of the fluid around the component is reduced and produces lower operating temperatures for the component. In at least one example, a working fluid exhibits a 4° C. decrease in temperature relative to a component at a depth of 1 meter in a conventional immersion tank. Defining separate volumes can allow for the customized control of boiling temperatures for different components of the server computer and/or for server computers at different locations inside an immersion tank or server rack.

As the working fluid carries away thermal energy through latent heat of boiling, managing the boiling temperature of the working fluid is beneficial for the performance of the immersion cooling system. In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components.

The working fluid has a boiling temperature below a critical temperature at which the heat-generating components experience thermal damage. For example, the heat-generating components may be computing components that experience damage above 100° Celsius (C). In some embodiments, the boiling temperature of the working fluid is less than a critical temperature of the heat-generating components. In some embodiments, the boiling temperature of the working fluid is less about 90° C. at 1 atmosphere of pressure. In some embodiments, the boiling temperature of the working fluid is less about 80° C. at 1 atmosphere of pressure. In some embodiments, the boiling temperature of the working fluid is less about 70° C. at 1 atmosphere of pressure. In some embodiments, the boiling temperature of the working fluid is less about 60° C. at 1 atmosphere of pressure. In some embodiments, the boiling temperature of the working fluid is at least about 35° C. at 1 atmosphere of pressure. In some embodiments, the working fluid includes water.

In some embodiments, the working fluid includes glycol. In some embodiments, the working fluid includes a combination of water and glycol. In some embodiments, the working fluid is an aqueous solution. In some embodiments, the working fluid is an electronic liquid, such as FC-72 available from 3M, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid.

Pumps, valves, inlet sizes, outlet sizes, and conduit diameters may all affect the fluid pressure inside a given volume in the immersion cooling system 300. For example, a flowrate of the tank pump 328 may be increased to force liquid working fluid 308 through the liquid return line 320 and pressurize the immersion chamber 304 of the immersion tank 302. In other examples, a vapor return line valve 344 in the vapor return line 318 may be opened or closed to alter the fluid pressure in the immersion chamber 304 by allowing more or less vapor working fluid 310 to exit the immersion tank 302.

In some embodiments, a fluid pressure in the on-component cooling loop may be changed by a component fluid pump 342 in communication with the component condenser 340. For example, a flowrate of the component fluid pump 342 may be increased to force liquid component working fluid 332 through the component liquid return line 336 and pressurize the liquid component working fluid 332 of the component tank 330. Increasing the pressure of a working fluid increases the boiling temperature of the working fluid in that volume. Similarly, decreasing the pressure of the working fluid decreases the boiling temperature of the working fluid. By altering the pressure in a volume of working fluid, the boiling temperature can be customized to the heat of the components being cooled.

For example, FIG. 3-2 is a flowchart illustrating an embodiment of a method 346 of thermal management using two volumes of working fluid, such as illustrated in FIG. 3-1 and elsewhere in the present disclosure. The method 346 includes immersing a first electronic component (e.g., high-capacity component 326) of the computing device (e.g., server computer 324) in a first working fluid at 348 (e.g., liquid component working fluid 332) and immersing a second electronic component (e.g., heat-generating component 314) of the computing device (e.g., server computer 324) in a second working fluid (e.g., liquid working fluid 308) at 350.

The method further includes changing a pressure of the first volume (e.g., the fluid pressure in the component tank 330) of the first working fluid in the first volume at 352. As described herein, the pressure can be changed through the use of pumps, valves, inlet and/or outlet sizes to control the flux of fluid in and/or out of a portion of the volume. In at least one example, a reservoir may store working fluid and a pump (e.g., the component fluid pump 342) may selectively introduce additional working fluid from the reservoir or remove working fluid to the reservoir to alter the pressure.

Figure 4:
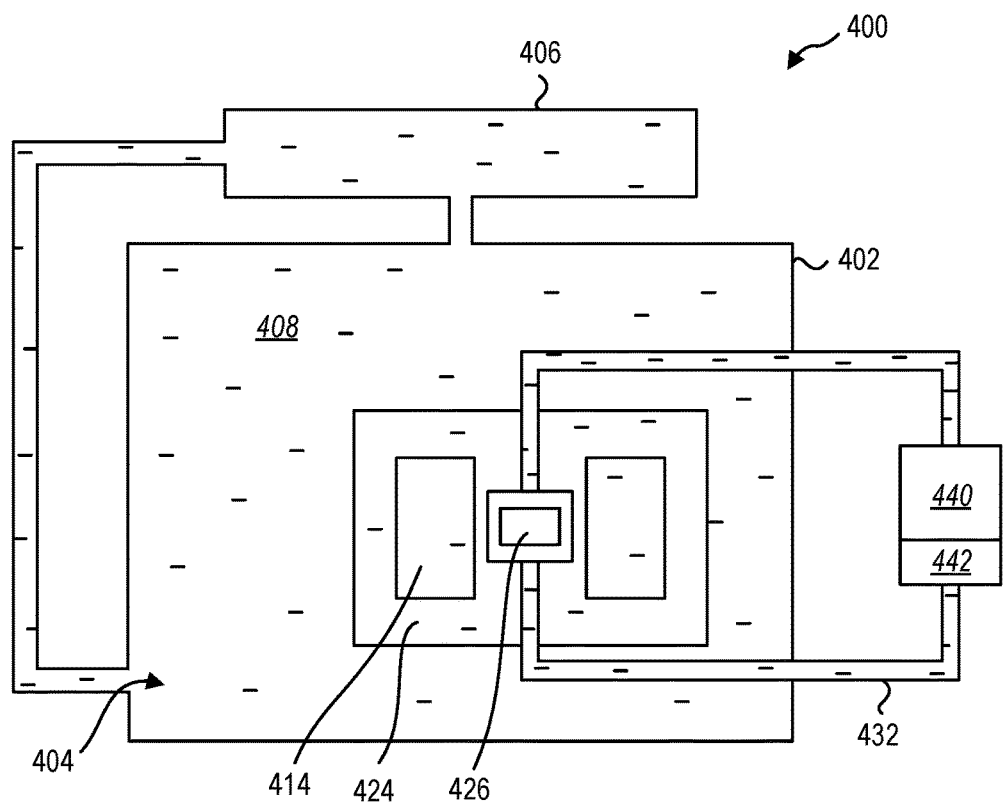
FIG. 4 is a side schematic representation of a single-phase immersion cooling system with an on-component cooling loop with single-phase immersion cooling, according to at least one embodiment of the present disclosure.

FIG. 4 is a schematic representation of an embodiment of an immersion cooling system 400 with two different volumes of single-phase working fluid for cooling different components of a computing device. The immersion cooling system 400 includes an immersion tank 402 with a server computer 424 (or other electronic device) immersed in a liquid working fluid 408. In the example of a single-phase immersion cooling system 400, the liquid working fluid 408 is not intended to boil. The liquid working fluid 408 may absorb heat from heat-generating components 414 and then may be circulated through a heat exchanger 406 to cool the liquid working fluid 408 before being returned to the immersion chamber 404. In some embodiments, there is some gas in the immersion chamber 404, while in other embodiments, the entire immersion chamber 404, heat exchanger 406 and associated conduits are filled with liquid working fluid 408. Vaporization of the liquid working fluid 408 may suddenly increase pressure and damage the immersion cooling system 400.

High-capacity components 426 may be cooled by a second volume of working fluid that is configured to handle higher temperatures and/or pressures than the immersion tank 402. For example, the high capacity components 426 may have on-component cooling by a liquid working fluid 432 that is pressurized to remain in a liquid phase above the boiling temperature at atmospheric pressure. For example, the liquid component working fluid 432 may be the same liquid working fluid 408 as in the immersion tank 402, but the high-capacity components 426 may operate at a temperature that would boil the liquid working fluid 408 in the immersion tank 402. By increasing the pressure in the volume around the high-capacity components 426, for example, with a component fluid pump 442 and/or valves, the liquid component working fluid 432 may have a higher boiling temperature. The on-component cooling loop may therefore also use a heat exchanger 440 instead of a condenser. In some embodiments or applications, it may be preferable to use a heat exchanger rather than a condenser, for example, due to space constraints, power constraints, or geometry limitations.

Figure 5:
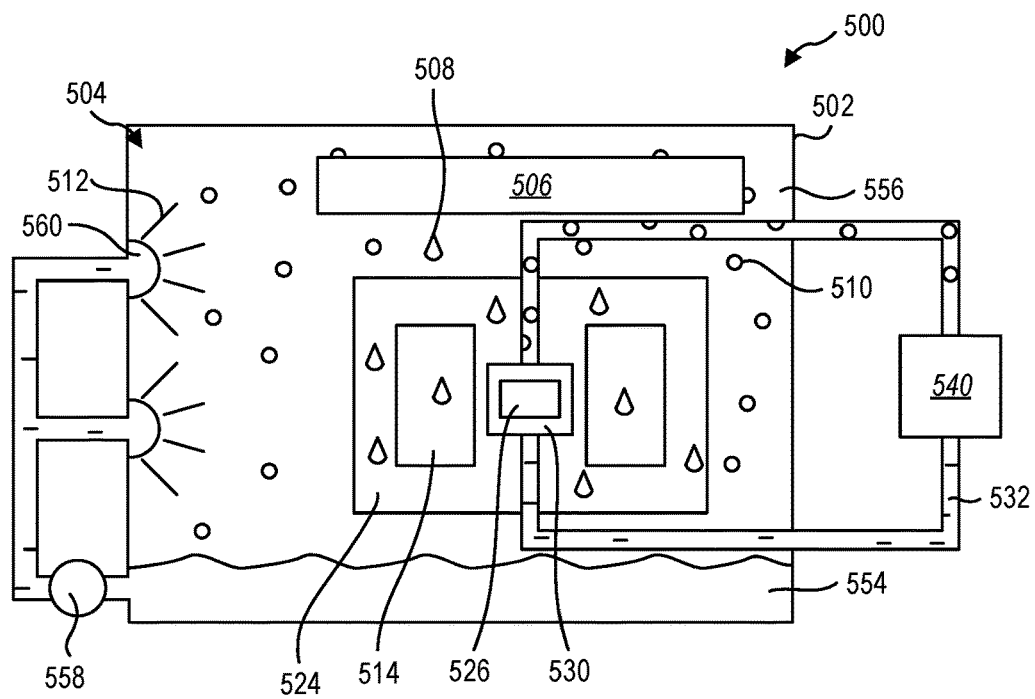
FIG. 5 is a side schematic representation of a two-phase immersion cooling system with an on-component cooling loop with single-phase immersion cooling, according to at least one embodiment of the present disclosure.

FIG. 5 is a schematic representation of an immersion cooling system 500 with a combination of single phase and two-phase cooling for cooling different components of a computing device. As described herein, the working fluid used in immersion cooling systems may be expensive or the working fluid may have negative environmental effects that make highly efficient use of the working fluid desirable. For example, a two-phase cooling system may spray a liquid working fluid onto the heat generating components in droplets to absorb heat from the heat-generating components. The droplets may vaporize into vapor working fluid, carrying away heat from the heat-generating components. A condenser 506 may subsequently condense the vapor working fluid 510 to liquid working fluid 508, which may drip back down through a headspace 556 of the tank 502 to a reservoir 554 of liquid working fluid 508 at the bottom of the tank 502.

In some embodiments, a nozzle pump 558 supplies liquid working fluid 508 to spray nozzles 560. The spray nozzle 560 sprays the liquid working fluid 508 to create a plurality of droplets 562. In addition to the condenser 506 condensing the vapor working fluid 510, the plurality of droplets 562 has an increased surface area to cool and condense the vapor working fluid 510, and the droplets 562 may provide a site onto which the vapor working fluid 510 may condense, further lessening the energy required to condense the vapor working fluid 510. Similar to a cold plate or cold surface in a conventional condenser, the droplets may be the subcooled surface that allow condensation upon the droplets themselves.

In some embodiments, the spray nozzles 560 are located on a sidewall of the immersion tank 502. In some embodiments, the spray nozzles 560 are located on top wall or lid of the immersion tank 502. In some embodiments, the spray nozzles 560 are located on both the sidewall and the top wall or lid of the immersion tank 502. In some embodiments, the spray nozzles 560 are positioned in the immersion bath or reservoir 554 of the liquid working fluid 508 to spray the droplets 562 upward into the headspace 556 to deliver the droplets 562 to the heat-generating components 514.

The spray nozzles 560 may be adjustable to vary the size of the droplets 562 depending upon desired flowrate through the nozzles 560 and the desired droplet size. In some embodiments, the spray nozzles 560 create a plurality of droplets 562 with an average droplet diameter of less than 1 millimeter. In some embodiments, the spray nozzles 560 create a plurality of droplets 562 with an average droplet diameter of less than 0.5 millimeters. In some embodiments, the spray nozzles 560 create a plurality of droplets 562 with an average droplet diameter of less than 0.25 millimeters. In some embodiments, the spray nozzles 560 create a plurality of droplets 562 with an average droplet diameter of less than 0.1 millimeters. In some embodiments, the spray nozzle 560 sprays the subcooled working fluid onto another component, such as a fan, which further disrupts the surface tension and creates the droplets 562 and/or more droplets.

While sprayed droplets 562 may efficiently cool the heat-generating components 514 using a comparatively small mass of liquid working fluid 508, the overall cooling capacity of the sprayed droplets 562 may be insufficient for the high-capacity components 526 of the server computer 524. In the illustrated embodiment of FIG. 5, the high-capacity component 526 is surrounded by a component tank 530. The component tank 530 contains a pressurized volume of the liquid working fluid 508 that allows for a single-phase immersion cooling loop for the high-capacity components 526. Immersing the high-capacity component 526 in a component liquid working fluid 532 may allow for greater convective cooling and higher thermal management capacity. A component heat exchanger 540 may then reject the waste heat to the environment.

In some embodiments, the component working fluid and the liquid working fluid in the immersion tank at large are the same working fluid. The high-capacity components may be cooled by a pressurized volume of liquid working fluid to maintain the liquid working fluid in a liquid phase while the liquid working fluid in the rest of the immersion chamber and/or headspace may be allowed to vaporize.

Figure 6:
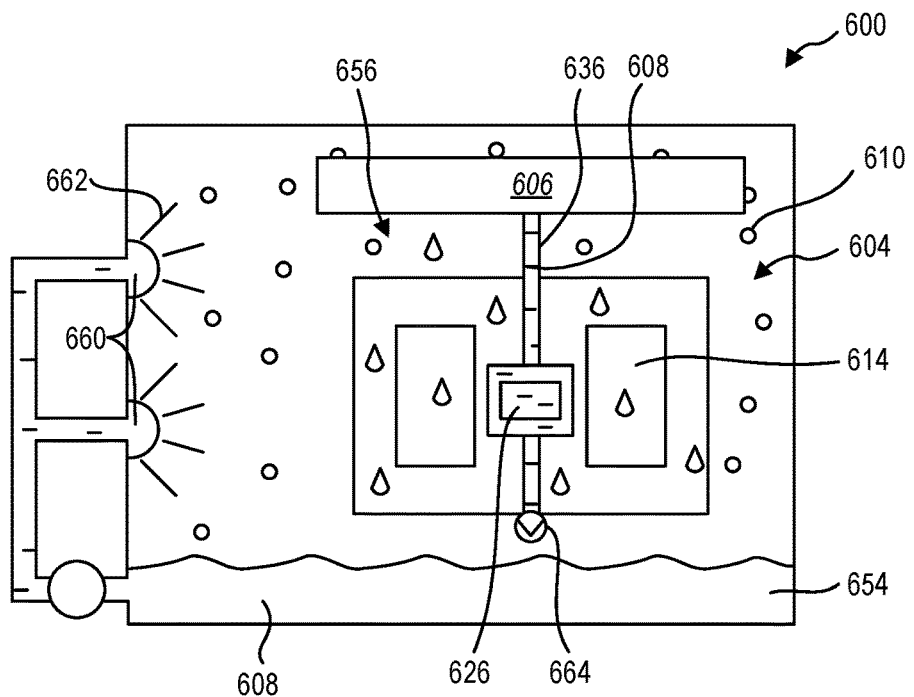
FIG. 6 is a side schematic representation of a two-phase immersion cooling system with an on-component cooling loop with single-phase immersion cooling that shared a working fluid with the immersion chamber, according to at least one embodiment of the present disclosure.

FIG. 6 is a schematic representation of an immersion cooling system 600 that shares working fluid between different volumes for cooling different components of a computing device. The high-capacity components 626 are cooled using forced convective liquid immersion cooling in the liquid working fluid 608, while the other heat-generating components 614 are cooled using two-phase cooling through sprayed droplets 662.

Similar to the embodiment described in relation to FIG. 5, the droplets 652 of liquid working fluid 608 may efficiently cool the heat-generating components 614 but have insufficient thermal management capacity to cool the high-capacity components 626. In some embodiments, the high-capacity components 626 are cooled with shared liquid working fluid 608 from the immersion chamber 604. The high-capacity components 626 may be cooled using convective cooling from immersion in flowing liquid working fluid 608. In some embodiments, the liquid working fluid 608 proximate the high-capacity component 626 is pressurized above the immersion chamber 604 at large to increase the boiling temperature of the liquid working fluid 608 and maintain the liquid working fluid 608 in the liquid phase. In some embodiments, the liquid working fluid 608 proximate the high-capacity component 626 is pressurized above the immersion chamber 604 at large to increase the boiling temperature of the liquid working fluid 608 and keep the boiling temperature within a threshold range of the temperature of the high-capacity component 626.

For example, a condenser 606 located in the headspace 656 of the immersion chamber 604 may condense the vapor working fluid 610 to liquid working fluid 608. The liquid working fluid 608 may be directed or pumped through a component liquid return line 636 toward the high-capacity component 626. The liquid working fluid 608 in the component liquid return line 636 may flow to and past the high-capacity component 626, absorbing heat from the high-capacity component 626. The liquid working fluid 608 pumped into the component liquid return line 636 may increase the pressure therein and proximate the high-capacity component 626 as the liquid working fluid 608 is restricted from exiting the fluid conduit (e.g., the volume proximate the high-capacity component 626) by an exit valve 664 or small area outlet that limits flowrates therethrough. When the liquid working fluid 608 exits through the exit valve 664, the hot liquid working fluid 608 may vaporize in the immersion chamber 604 and introduce vapor working fluid 610 into the immersion chamber 604. If the high-capacity component 626 does not heat the liquid working fluid 608 beyond the boiling temperature at the fluid pressure in the immersion chamber 604 at large, the liquid working fluid 608 will remain in the liquid phase and fall to the reservoir 654 below to be circulated through the spray nozzles 660.

Figure 7:
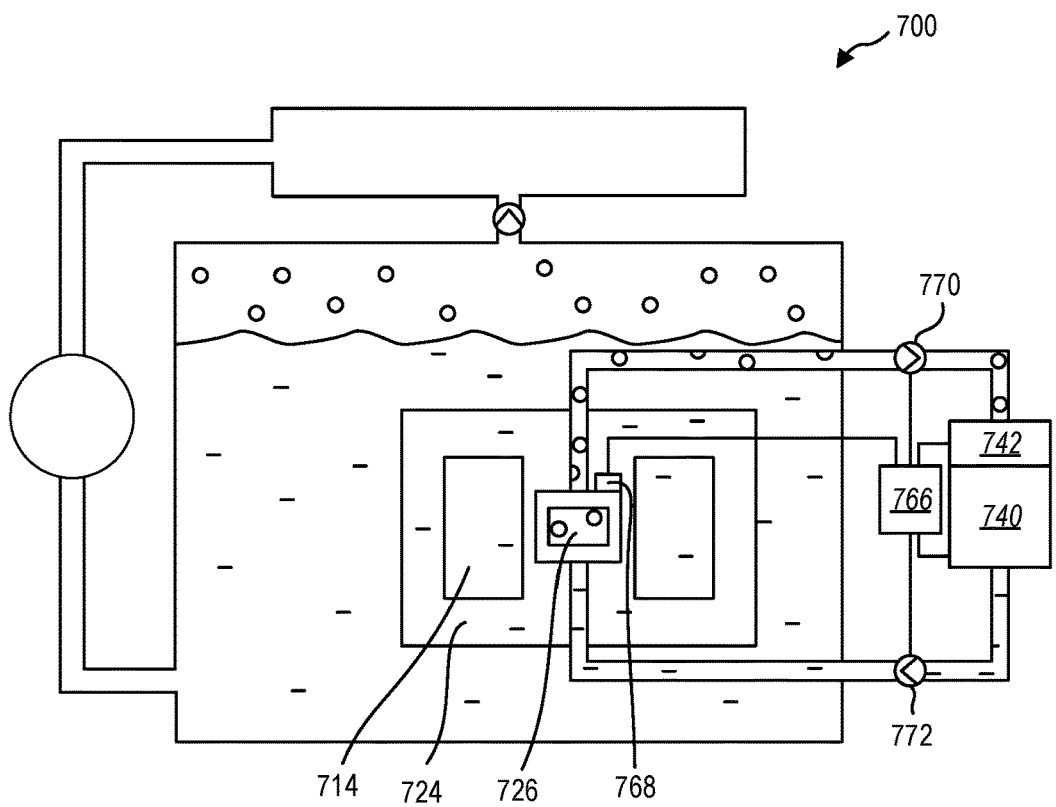
FIG. 7 is a side schematic representation of a two-phase immersion cooling system with an on-component cooling loop with two-phase immersion cooling and a controller that adjusts the fluid pressure in the on-component cooling loop, according to at least one embodiment of the present disclosure.

As described in relation to FIG. 6, in some embodiments, the volume proximate the high-capacity components may be pressurized to maintain the boiling temperature of the working fluid at or near the operating temperature of the high-capacity components. FIG. 7 is a schematic representation of an immersion cooling system 700 with two-phase cooling for cooling different components of a computing device. The immersion cooling system 700 may cool the heat-generating components 714 of the server computer 724 with two-phase immersion cooling, while the high-capacity component(s) 726 have on-component cooling with a different volume of working fluid.

As described herein, most efficient two-phase cooling occurs when the liquid working fluid absorbs heat from the component(s) and boils. The working fluid can absorb heat in the form of the latent heat of boiling to expand without increasing in temperature. The working fluid can, therefore, vaporize and the vapor working fluid can form bubbles which rise out of the liquid working fluid without the liquid working fluid around the component heating beyond the boiling temperature. However, if the component operating temperature is significantly above the boiling temperature, dryout can occur with insufficient thermal mass in contact with the surface of the component. In some embodiments, it may be beneficial to adjust the working fluid boiling temperature to be below the operating temperature, but within a threshold value of the operating temperature.

In some embodiments, the target boiling temperature is in a range including a lower value of less than 5° C. less than the operating temperature of the high-capacity component. In some embodiments, the target boiling temperature is in a range that includes a lower value of less than 3° C. less than the operating temperature of the high-capacity component. In some embodiments, the target boiling temperature is in a range that includes a lower value of less than 1° C. less than the operating temperature of the high-capacity component. For example, it may be beneficial to adjust the fluid pressure in the volume to change the boiling temperature to 1° C. less than the current operating temperature of the high-capacity component.

In some embodiments, the target boiling temperature is greater than the operating temperature of the high-capacity component to prevent the working fluid from boiling. In some embodiments, the target boiling temperature is in a range including an upper value of less than 5° C. greater than the operating temperature of the high-capacity component. In some embodiments, the target boiling temperature is in a range including an upper value of less than 3° C. greater than the operating temperature of the high-capacity component. In some embodiments, the target boiling temperature is in a range including an upper value of less than 1° C. greater than the operating temperature of the high-capacity component.

FIG. 7 illustrates an embodiment of an immersion cooling system 700 with a plurality of pressure control mechanisms, such as pumps, valves, or other adjustable portions of the on-component cooling loop that are in communication with a controller 766. The controller 766 receives measurements from one or more sensors 768, such as a pressure sensor or temperature sensor, to determine whether and when to alter the fluid pressure proximate the high-capacity component 726.

In some embodiments, the sensor 768 is a temperature sensor that measures an operating temperature of the high-capacity component 726. In other embodiments, the sensor 768 measures an electrical power draw of the high-capacity component 726, which may be used to calculate an operating temperature of the high-capacity component 726. The controller 766 can, based at least partially on the component operating temperature, determine a target boiling temperature for the working fluid proximate the high-capacity component 726. In some embodiments, the sensor 768 includes a pressure sensor that measures the fluid pressure proximate the high-capacity component 726 and reports the fluid pressure to the controller 766.

The controller 766 may be in data communication with a component condenser 740, a fluid pump 742, and/or one or more valves 770, 772 to control relative flow rates through portions of the on-component cooling loop. For example, the controller 766 may reduce flow through an outlet valve 770 out of the portion of the volume proximate the high-capacity component 726 to increase the fluid pressure proximate the high-capacity component 726. In some examples, the controller 766 may reduce flow through an inlet valve 772 into the portion of the volume proximate the high-capacity component 726 to decrease the fluid pressure proximate the high-capacity component 726. In some examples, the controller 766 may increase flow through the fluid pump 742 toward the portion of the volume proximate the high-capacity component 726 to increase the fluid pressure proximate the high-capacity component 726. In some examples, the controller 766 may increase condensation rates of the component condenser 740 to decrease the fluid pressure throughout the on-component cooling loop. In some embodiments, the controller 766 may perform a combination of the above examples or other procedures to adjust the fluid pressure proximate the high-capacity component 726. For example, as described in relation to FIG. 3-2, a reservoir may store working fluid and a pump (e.g., the component fluid pump 742) may selectively introduce additional working fluid from the reservoir or remove working fluid to the reservoir to alter the pressure.

Figure 8:
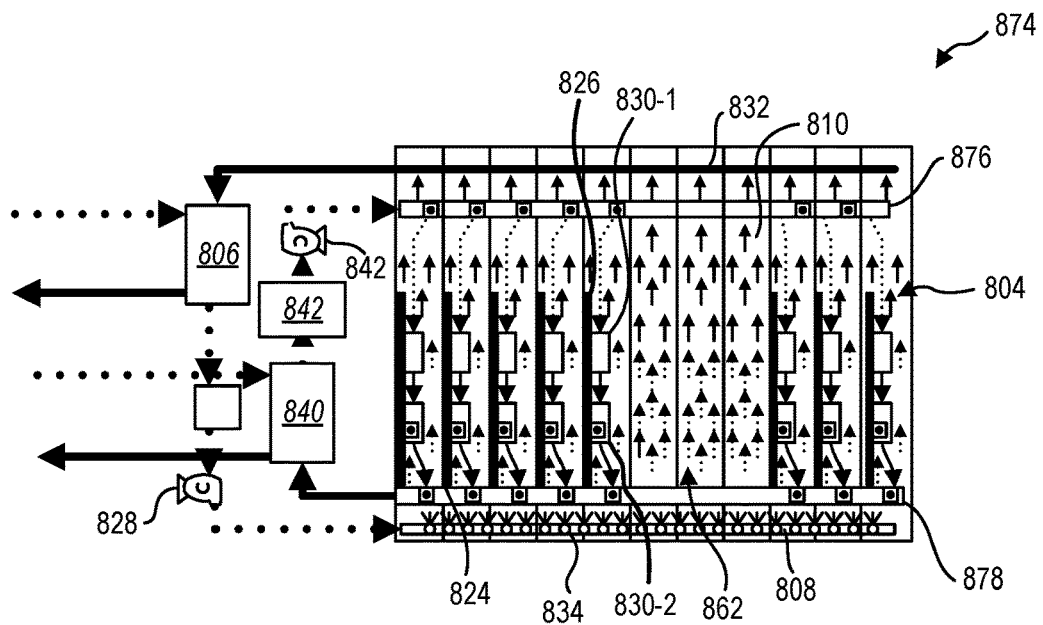
FIG. 8 is a side schematic representation of a server rack with a two-phase immersion cooling system with an on-component cooling loop for each server blade that is connected to a shared manifold, according to at least one embodiment of the present disclosure.

While examples and embodiments described herein refer to a single computer in an immersion tank, it should be understood that any example or embodiment described herein may be applicable to a rack or a tank with a plurality of computing devices or blades positioned therein. FIG. 8 is a schematic representation of a server rack 874 including a plurality of blades of server computers 824 with different volumes for cooling different components of server computers 824 positioned on the blades. A plurality of server computers 824 have on-component cooling loops that connect to an inlet manifold 876 and an outlet manifold 878 of the rack 874. The first volume of working fluid is the on-component cooling loop that includes component tanks 830-1, 830-2 around the high-capacity components 826 on the server computer 824 of the blade. Fluid conduits connect the component tanks 830-1, 830-2 to the shared inlet manifold 876 and the shared outlet manifold 878 used by the plurality of server blades. The component vapor working fluid 834 is circulated by a component fluid pump 842 through a component heat exchanger 840 or condenser to cool the component working fluid before returning the component liquid working fluid 832 to the inlet manifold 876.

In some embodiments, the second volume of working fluid is the immersion chamber 804 into which the server blades are positioned in the rack 874. The liquid working fluid 808 is sprayed into the immersion chamber 804 in droplets 862 before heat-generating components of the server computers 824 vaporize the liquid working fluid 808 into vapor working fluid 810. The vapor working fluid 810 is removed to an external heat exchanger 806 or condenser. The condensed liquid working fluid 808 is returned by a fluid pump 828. The first volume and second volume are maintained at different temperatures to adjust the boiling temperatures of the working fluids.

Figure 9:
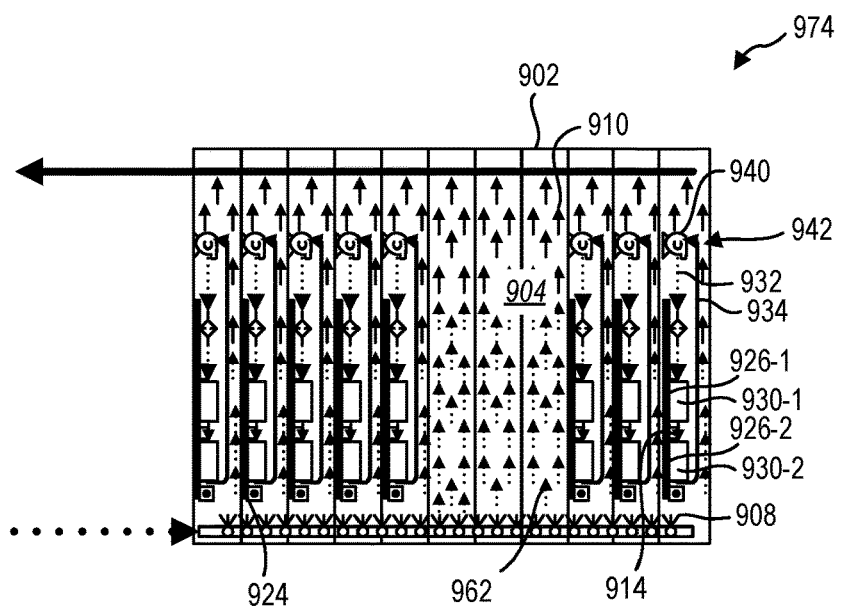
FIG. 9 is a side schematic representation of a server rack with a two-phase immersion cooling system with a self-contained on-component cooling loop for each server blade, according to at least one embodiment of the present disclosure.

FIG. 9 is a schematic representation of another server rack 974 with a recirculating cooling volume on the high-capacity components 926 of at least some of the server computers 924, and the server computers 924 are positioned in an immersion tank 902 for cooling the remaining heat-generating components 914 with a second volume of working fluid.

In some embodiments, each blade or server computer 924 includes a self-contained on-component cooling loop with a working fluid therein. The on-component cooling loop includes a component condenser 940 and, optionally, a component fluid pump 942, to cool the component working fluid and direct the component liquid working fluid 932 toward the component tanks 930-1, 930-2 on the same server computer 924. The high-capacity components 926-1, 926-2 contained in the component tanks 930-1, 930-2 heat the working fluid and the component vapor working fluid 934 is returned to the component condenser 940.

In some embodiments, the other heat-generating components 914 of the server computers 924 are cooled by the second volume of working fluid, which is maintained at a different pressure than the first volume in the on-component cooling loop of each server computer 924. In some embodiments, the second volume of working fluid is the immersion chamber 904 into which the server blades are positioned in the rack 974. The liquid working fluid 908 is sprayed into the immersion chamber 904 in droplets 962 before heat-generating components of the server computers 924 vaporize the liquid working fluid 908 into vapor working fluid 910. The vapor working fluid 910 may be removed to an external heat exchanger or condenser or condensed in the immersion chamber 904 and allowed to drip down toward the bottom of the immersion chamber 904. The first volume and second volume are maintained at different temperatures to adjust the boiling temperatures of the working fluids. In some embodiments, each self-contained on-component cooling loop may operate at fluid pressures independent of the fluid pressures of other self-contained on-component cooling loops on other server computers 924 in the server rack 974.

INDUSTRIAL APPLICABILITY

The present disclosure relates generally to systems and methods for thermal management of electronic devices or other heat-generating components Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the hot working fluid can be circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of boiling.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a heat exchanger to cool the liquid phase and/or a condenser to extract heat from the vapor phase of the working fluid. The heat exchanger may include a condenser that condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid.

Whether the immersion cooling system is a two-phase cooling system (wherein the working fluid vaporizes and condenses in a cycle) or a one-phase cooling system (wherein the working fluid remains in a single phase in a cycle), the heat transported from the heat-generating components outside of the immersion chamber is further exchanged with an ambient fluid to exhaust the heat from the system.

In some embodiments, an immersion cooling system according to the present disclosure includes an immersion tank defining an immersion chamber with a working fluid positioned therein. The working fluid transitions between a liquid working fluid phase and a vapor working fluid phase to remove heat from hot or heat-generating components in the immersion chamber. The liquid working fluid more efficiency receives heat from the heat-generating components and, upon transition to the vapor working fluid, the vapor working fluid can be removed from the immersion tank, cooled and condensed by the condenser (or other heat exchanger) to extract the heat from the working fluid, and the liquid working fluid can be returned to the liquid immersion bath.

In some embodiments, the immersion bath of the liquid working fluid has a plurality of heat-generating components positioned in the liquid working fluid. The liquid working fluid surrounds at least a portion of the heat-generating components and other objects or parts attached to the heat-generating components. In some embodiments, the heat-generating components are positioned in the liquid working fluid on one or more supports. The support may support one or more heat-generating components in the liquid working fluid and allow the working fluid to move around the heat-generating components. In some embodiments, the support is thermally conductive to conduct heat from the heat-generating components. The support(s) may increase the effective surface area from which the liquid working fluid may remove heat through convective cooling.

In some embodiments, the heat-generating components include electronic or computing components or power supplies. In some embodiments, the heat-generating components include computer devices, such as individual personal computer or server blade computers. In some embodiments, one or more of the heat-generating components includes a heat sink or other device attached to the heat-generating component to conduct away thermal energy and effectively increase the surface area of the heat-generating component. In some embodiments, the heat-generating components include an electric motor.

As described, conversion of the liquid working fluid to a vapor phase requires the input of thermal energy to overcome the latent heat of vaporization and may be an effective mechanism to increase the thermal capacity of the working fluid and remove heat from the heat-generating components. Because the vapor working fluid rises in the liquid working fluid, the vapor working fluid can be extracted from the immersion chamber in an upper vapor region of the chamber. A condenser cools part of the vapor working fluid back into a liquid working fluid, removing thermal energy from the system and the working fluid into the immersion bath of the liquid working fluid. The condenser radiates or otherwise dumps the thermal energy from the working fluid into the ambient environment or into a conduit to carry the thermal energy away from the cooling system.

In conventional immersion cooling systems, a liquid-cooled condenser is integrated into the immersion tank and/or the chamber to efficiency remove the thermal energy from the working fluid. In some embodiments according to the present disclosure, an immersion cooling system for thermal management of computing devices allows at least one immersion tank and/or chamber to be connected to and in fluid communication with an external condenser. In some embodiments, an immersion cooling system includes a vapor return line that connects the immersion tank to the condenser and allows vapor working fluid to enter the condenser from the immersion tank and/or chamber and a liquid return line that connects the immersion tank to the condenser and allows liquid working fluid to return to the immersion tank and/or chamber.

The vapor return line may be colder than the boiling temperature of the working fluid. In some embodiments, a portion of the vapor working fluid condenses in the vapor return line. The vapor return line can, in some embodiments, be oriented at an angle such that the vapor return line is non-perpendicular to the direction of gravity. The condensed working fluid can then drain either back to the immersion tank or forward to the condenser depending on the direction of the vapor return line slope. In some embodiments, the vapor return line includes a liquid collection line or valve, like a bleeder valve, that allows the collection and/or return of the condensed working fluid to the immersion tank or condenser.

In some examples, an immersion cooling system includes an air-cooled condenser. An air-cooled condenser may require fans or pumps to force ambient air over one or more heat pipes or fins to conduct heat from the condenser to the air.

In some embodiments, a server computer or other computing device is positioned inside an immersion tank for cooling. The immersion tank houses a working fluid that cools the server computer by absorbing heat from the components of the server computer. The liquid working fluid may vaporize into vapor working fluid which rises in the tank toward a condenser.

In some embodiments, immersion cooling system includes on-component cooling that includes a separate volume of working fluid to cool the high-capacity components of the server computer, such as a CPU, GPU, or other components that generate large amounts of heat. Other heat-generating components on the server computer may be cooled by the liquid working fluid in the immersion tank, generally.

The immersion cooling system includes a vapor return line to the condenser and a liquid return line from the condenser to the immersion chamber of the immersion tank. The condenser rejects heat to the ambient atmosphere to remove heat from the system and return the cooled liquid working fluid to the immersion chamber to continue cooling the heat-generating components. A tank pump may be positioned in the vapor return line or liquid return line to circulate the working fluid.

The on-component cooling volume includes a component tank positioned on the high-capacity component to hold a liquid component working fluid around and/or in contact with a surface of the high-capacity component. The high-capacity component may heat or vaporize the liquid component working fluid and convert the liquid component working fluid to vapor component working fluid. The liquid component working fluid may be delivered to the component tank by a component liquid return line and the vapor component working fluid carries away heat from the high-capacity component through a component vapor return line. The component vapor return line directs the vapor component working fluid to a component condenser that condenses the vapor component working fluid back to a liquid component working fluid and rejects the heat to the ambient atmosphere. In at least one example, the working fluid in the immersion tank and the component working fluid in the component cooling loop are the same working fluid. Using the same working fluid may simplify maintenance by only requiring the stocking and maintenance of a single fluid and/or simplify repairs by ensuring that leaks of a first working fluid in one volume do not contaminate the second working fluid in the other volume. However, using a single working fluid results in a working fluid with a single boiling temperature, despite the components of the server computer (e.g., the heat-generating components and high-capacity components) operating at different temperatures.

Because the working fluid can carry away heat most efficiently by absorbing heat through the latent heat of boiling, the working fluid may work most efficiently when the boiling temperature of the working fluid is at or near the operating temperature of the components being cooled. In other examples, it may be desirable to prevent boiling, as the liquid working fluid may expand by 100 times or more upon vaporization into vapor working fluid. Unintended or undesirable vaporization may cause an increase in pressure that may damage the immersion cooling system. Rapid vaporization can cause a dryout effect when the surface of a heat-generating component vaporizes the liquid cooling fluid so rapidly that an insufficient mass of liquid working fluid contacts the surface of the heat-generating component, which compromises the convective cooling on the surface of the heat-generating component and allows the temperature thereof to increase too quickly.

Additionally, working fluid is recycled through the volumes of the thermal management system, and, in some embodiments, the working fluid is a dielectric fluid or other fluid that is expensive. A thermal management system that uses less working fluid and/or uses the working fluid more efficiently allows for cost savings in the working fluid. In some embodiments, the working fluid is relatively dense and containing large volumes of the working fluid requires a strong container. Building and maintaining containers for large volumes and/or masses of working fluid can increase construction costs and container weight, which limits transport and maintenance of the containers.

In a conventional immersion tank, the liquid pressure increases as depth of the immersion bath increases. In conventional tanks and fluids, a depth of 1 meter results in a 2.3 pounds per square inch (PSI) increase. The increased pressure results in an increase in the boiling point for the working fluid and a resulting temperature increase of the components adjacent the working fluid at the bottom of the immersion bath. When separate immersion chambers are placed around heat-generating components, and/or the boards are oriented horizontally, the columnar pressure of the fluid around the component is reduced and produces lower operating temperatures for the component. In at least one example, a working fluid exhibits a 4° C. decrease in temperature relative to a component at a depth of 1 meter in a conventional immersion tank. Defining separate volumes can allow for the customized control of boiling temperatures for different components of the server computer and/or for server computers at different locations inside an immersion tank or server rack.

As the working fluid carries away thermal energy through latent heat of boiling, managing the boiling temperature of the working fluid is beneficial for the performance of the immersion cooling system. In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components.

The working fluid has a boiling temperature below a critical temperature at which the heat-generating components experience thermal damage. For example, the heat-generating components may be computing components that experience damage above 100° Celsius (C). In some embodiments, the boiling temperature of the working fluid is less than a critical temperature of the heat-generating components. In some embodiments, the boiling temperature of the working fluid is less about 90° C. at 1 atmosphere of pressure. In some embodiments, the boiling temperature of the working fluid is less about 80° C. at 1 atmosphere of pressure. In some embodiments, the boiling temperature of the working fluid is less about 70° C. at 1 atmosphere of pressure. In some embodiments, the boiling temperature of the working fluid is less about 60° C. at 1 atmosphere of pressure. In some embodiments, the boiling temperature of the working fluid is at least about 35° C. at 1 atmosphere of pressure. In some embodiments, the working fluid includes water.

In some embodiments, the working fluid includes glycol. In some embodiments, the working fluid includes a combination of water and glycol. In some embodiments, the working fluid is an aqueous solution. In some embodiments, the working fluid is an electronic liquid, such as FC-72 available from 3M, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid.

Pumps, valves, inlet sizes, outlet sizes, and conduit diameters may all affect the fluid pressure inside a given volume in the immersion cooling system. For example, a flowrate of the tank pump may be increased to force liquid working fluid through the liquid return line and pressurize the immersion chamber of the immersion tank. In other examples, a vapor return line valve in the vapor return line may be opened or closed to alter the fluid pressure in the immersion chamber by allowing more or less vapor working fluid to exit the immersion tank.

In some embodiments, a fluid pressure in the on-component cooling loop may be changed by a component fluid pump in communication with the component condenser. For example, a flowrate of the component fluid pump may be increased to force liquid component working fluid through the component liquid return line and pressurize the liquid component working fluid of the component tank. Increasing the pressure of a working fluid increases the boiling temperature of the working fluid in that volume. Similarly, decreasing the pressure of the working fluid decreases the boiling temperature of the working fluid. By altering the pressure in a volume of working fluid, the boiling temperature can be customized to the heat of the components being cooled.

In some embodiments, a method of thermal management for server components includes immersing a first electronic component of the computing device in a first working fluid and immersing a second electronic component of the computing device in a second working fluid.

The method further includes changing a pressure of the first volume (e.g., the fluid pressure in the component tank) of the first working fluid in the first volume at. As described herein, the pressure can be changed through the use of pumps, valves, inlet and/or outlet sizes to control the flux of fluid in and/or out of a portion of the volume. In at least one example, a reservoir may store working fluid and a pump (e.g., the component fluid pump) may selectively introduce additional working fluid from the reservoir or remove working fluid to the reservoir to alter the pressure.

In some embodiments, the immersion cooling system includes an immersion tank with a server computer (or other electronic device) immersed in a liquid working fluid. In the example of a single-phase immersion cooling system, the liquid working fluid is not intended to boil. The liquid working fluid may absorb heat from heat-generating components and then may be circulated through a heat exchanger to cool the liquid working fluid before being returned to the immersion chamber. In some embodiments, there is some gas in the immersion chamber, while in other embodiments, the entire immersion chamber, heat exchanger and associated conduits are filled with liquid working fluid. Vaporization of the liquid working fluid may suddenly increase pressure and damage the immersion cooling system.

High-capacity components may be cooled by a second volume of working fluid that is configured to handle higher temperatures and/or pressures than the immersion tank. For example, the high-capacity components may have on-component cooling by a liquid working fluid that is pressurized to remain in a liquid phase above the boiling temperature at atmospheric pressure. For example, the liquid component working fluid may be the same liquid working fluid as in the immersion tank, but the high-capacity components may operate at a temperature that would boil the liquid working fluid in the immersion tank. By increasing the pressure in the volume around the high-capacity components, for example, with a component fluid pump and/or valves, the liquid component working fluid may have a higher boiling temperature. The on-component cooling loop may therefore also use a heat exchanger instead of a condenser. In some embodiments or applications, it may be preferable to use a heat exchanger rather than a condenser, for example, due to space constraints, power constraints, or geometry limitations.

As described herein, the working fluid used in immersion cooling systems may be expensive or the working fluid may have negative environmental effects that make highly efficient use of the working fluid desirable. For example, a two-phase cooling system may spray a liquid working fluid onto the heat generating components in droplets to absorb heat from the heat-generating components. The droplets may vaporize into vapor working fluid, carrying away heat from the heat-generating components. A condenser may subsequently condense the vapor working fluid to liquid working fluid, which may drip back down through a headspace of the tank to a reservoir of liquid working fluid at the bottom of the tank.

In some embodiments, a nozzle pump supplies liquid working fluid to spray nozzles. The spray nozzle sprays the liquid working fluid to create a plurality of droplets. In addition to the condenser condensing the vapor working fluid, the plurality of droplets has an increased surface area to cool and condense the vapor working fluid, and the droplets may provide a site onto which the vapor working fluid may condense, further lessening the energy required to condense the vapor working fluid. Similar to a cold plate or cold surface in a conventional condenser, the droplets may be the subcooled surface that allow condensation upon the droplets themselves.

In some embodiments, the spray nozzles are located on a sidewall of the immersion tank. In some embodiments, the spray nozzles are located on top wall or lid of the immersion tank. In some embodiments, the spray nozzles are located on both the sidewall and the top wall or lid of the immersion tank. In some embodiments, the spray nozzles are positioned in the immersion bath or reservoir of the liquid working fluid to spray the droplets upward into the headspace to deliver the droplets to the heat-generating components.

The spray nozzles may be adjustable to vary the size of the droplets depending upon desired flowrate through the nozzles and the desired droplet size. In some embodiments, the spray nozzles create a plurality of droplets with an average droplet diameter of less than 1 millimeter. In some embodiments, the spray nozzles create a plurality of droplets with an average droplet diameter of less than 0.5 millimeters. In some embodiments, the spray nozzles create a plurality of droplets with an average droplet diameter of less than 0.25 millimeters. In some embodiments, the spray nozzles create a plurality of droplets with an average droplet diameter of less than 0.1 millimeters. In some embodiments, the spray nozzle sprays the subcooled working fluid onto another component, such as a fan, which further disrupts the surface tension and creates the droplets and/or more droplets.

While sprayed droplets may efficiently cool the heat-generating components using a comparatively small mass of liquid working fluid, the overall cooling capacity of the sprayed droplets may be insufficient for the high-capacity components of the server computer. In some embodiments, the high-capacity component is surrounded by a component tank. The component tank contains a pressurized volume of the liquid working fluid that allows for a single-phase immersion cooling loop for the high-capacity components. Immersing the high-capacity component in a component liquid working fluid may allow for greater convective cooling and higher thermal management capacity. A component heat exchanger may then reject the waste heat to the environment.

In some embodiments, the component working fluid and the liquid working fluid in the immersion tank at large are the same working fluid. The high-capacity components may be cooled by a pressurized volume of liquid working fluid to maintain the liquid working fluid in a liquid phase while the liquid working fluid in the rest of the immersion chamber and/or headspace may be allowed to vaporize.

The high-capacity components are cooled using forced convective liquid immersion cooling in the liquid working fluid, while the other heat-generating components are cooled using two-phase cooling through sprayed droplets.

In some embodiments, the droplets of liquid working fluid may efficiently cool the heat-generating components but have insufficient thermal management capacity to cool the high-capacity components. In some embodiments, the high-capacity components are cooled with shared liquid working fluid from the immersion chamber. The high-capacity components may be cooled using convective cooling from immersion in flowing liquid working fluid. In some embodiments, the liquid working fluid proximate the high-capacity component is pressurized above the immersion chamber at large to increase the boiling temperature of the liquid working fluid and maintain the liquid working fluid in the liquid phase. In some embodiments, the liquid working fluid proximate the high-capacity component is pressurized above the immersion chamber at large to increase the boiling temperature of the liquid working fluid and keep the boiling temperature within a threshold range of the temperature of the high-capacity component.

For example, a condenser located in the headspace of the immersion chamber may condense the vapor working fluid to liquid working fluid. The liquid working fluid may be directed or pumped through a component liquid return line toward the high-capacity component. The liquid working fluid in the component liquid return line may flow to and past the high-capacity component, absorbing heat from the high-capacity component. The liquid working fluid pumped into the component liquid return line may increase the pressure therein and proximate the high-capacity component as the liquid working fluid is restricted from exiting the fluid conduit (e.g., the volume proximate the high-capacity component) by an exit valve or small area outlet that limits flowrates therethrough. When the liquid working fluid exits through the exit valve, the hot liquid working fluid may vaporize in the immersion chamber and introduce vapor working fluid into the immersion chamber. If the high-capacity component does not heat the liquid working fluid beyond the boiling temperature at the fluid pressure in the immersion chamber at large, the liquid working fluid will remain in the liquid phase and fall to the reservoir below to be circulated through the spray nozzles.

In some embodiments, the volume proximate the high-capacity components may be pressurized to maintain the boiling temperature of the working fluid at or near the operating temperature of the high-capacity components. The immersion cooling system may cool the heat-generating components of the server computer with two-phase immersion cooling, while the high-capacity component(s) have on-component cooling with a different volume of working fluid.

As described herein, most efficient two-phase cooling occurs when the liquid working fluid absorbs heat from the component(s) and boils. The working fluid can absorb heat in the form of the latent heat of boiling to expand without increasing in temperature. The working fluid can, therefore, vaporize and the vapor working fluid can form bubbles which rise out of the liquid working fluid without the liquid working fluid around the component heating beyond the boiling temperature. However, if the component operating temperature is significantly above the boiling temperature, dryout can occur with insufficient thermal mass in contact with the surface of the component. In some embodiments, it may be beneficial to adjust the working fluid boiling temperature to be below the operating temperature, but within a threshold value of the operating temperature.

In some embodiments, the target boiling temperature is in a range including a lower value of less than 5° C. less than the operating temperature of the high-capacity component. In some embodiments, the target boiling temperature is in a range that includes a lower value of less than 3° C. less than the operating temperature of the high-capacity component. In some embodiments, the target boiling temperature is in a range that includes a lower value of less than 1° C. less than the operating temperature of the high-capacity component. For example, it may be beneficial to adjust the fluid pressure in the volume to change the boiling temperature to 1° C. less than the current operating temperature of the high-capacity component.

In some embodiments, the target boiling temperature is greater than the operating temperature of the high-capacity component to prevent the working fluid from boiling. In some embodiments, the target boiling temperature is in a range including an upper value of less than 5° C. greater than the operating temperature of the high-capacity component. In some embodiments, the target boiling temperature is in a range including an upper value of less than 3° C. greater than the operating temperature of the high-capacity component. In some embodiments, the target boiling temperature is in a range including an upper value of less than 1° C. greater than the operating temperature of the high-capacity component.

In some embodiments, an immersion cooling system includes a plurality of pressure control mechanisms, such as pumps, valves, or other adjustable portions of the on-component cooling loop that are in communication with a controller. The controller receives measurements from one or more sensors, such as a pressure sensor or temperature sensor, to determine whether and when to alter the fluid pressure proximate the high-capacity component.

In some embodiments, the sensor is a temperature sensor that measures an operating temperature of the high-capacity component. In other embodiments, the sensor measures an electrical power draw of the high-capacity component, which may be used to calculate an operating temperature of the high-capacity component. The controller can, based at least partially on the component operating temperature, determine a target boiling temperature for the working fluid proximate the high-capacity component. In some embodiments, the sensor includes a pressure sensor that measures the fluid pressure proximate the high-capacity component and reports the fluid pressure to the controller.

The controller may be in data communication with a component condenser, a fluid pump, and/or one or more valves to control relative flow rates through portions of the on-component cooling loop. For example, the controller may reduce flow through an outlet valve out of the portion of the volume proximate the high-capacity component to increase the fluid pressure proximate the high-capacity component. In some examples, the controller may reduce flow through an inlet valve into the portion of the volume proximate the high-capacity component to decrease the fluid pressure proximate the high-capacity component. In some examples, the controller may increase flow through the fluid pump toward the portion of the volume proximate the high-capacity component to increase the fluid pressure proximate the high-capacity component. In some examples, the controller may increase condensation rates of the component condenser to decrease the fluid pressure throughout the on-component cooling loop. In some embodiments, the controller may perform a combination of the above examples or other procedures to adjust the fluid pressure proximate the high-capacity component. For example, a reservoir may store working fluid and a pump (e.g., the component fluid pump) may selectively introduce additional working fluid from the reservoir or remove working fluid to the reservoir to alter the pressure.

While examples and embodiments described herein refer to a single computer in an immersion tank, it should be understood that any example or embodiment described herein may be applicable to a rack or a tank with a plurality of computing devices or blades positioned therein. In some embodiments, a plurality of server computers each have on-component cooling loops that connect to an inlet manifold and an outlet manifold of the rack. The first volume of working fluid is the on-component cooling loop that includes component tanks around the high-capacity components on the server computer of the blade. Fluid conduits connect the component tanks to the shared inlet manifold and the shared outlet manifold used by the plurality of server blades. The component vapor working fluid is circulated by a component fluid pump through a component heat exchanger or condenser to cool the component working fluid before returning the component liquid working fluid to the inlet manifold.

In some embodiments, the second volume of working fluid is the immersion chamber into which the server blades are positioned in the rack. The liquid working fluid is sprayed into the immersion chamber in droplets before heat-generating components of the server computers vaporize the liquid working fluid into vapor working fluid. The vapor working fluid is removed to an external heat exchanger or condenser. The condensed liquid working fluid is returned by a fluid pump. The first volume and second volume are maintained at different temperatures to adjust the boiling temperatures of the working fluids.

In some embodiments, each blade or server computer includes a self-contained on-component cooling loop with a working fluid therein. The on-component cooling loop includes a component condenser and, optionally, a component fluid pump, to cool the component working fluid and direct the component liquid working fluid toward the component tanks on the same server computer. The high-capacity components contained in the component tanks heat the working fluid and the component vapor working fluid is returned to the component condenser.

In some embodiments, the other heat-generating components of the server computers are cooled by the second volume of working fluid, which is maintained at a different pressure than the first volume in the on-component cooling loop of each server computer. In some embodiments, the second volume of working fluid is the immersion chamber into which the server blades are positioned in the rack. The liquid working fluid is sprayed into the immersion chamber in droplets before heat-generating components of the server computers vaporize the liquid working fluid into vapor working fluid. The vapor working fluid may be removed to an external heat exchanger or condenser or condensed in the immersion chamber and allowed to drip down toward the bottom of the immersion chamber. The first volume and second volume are maintained at different temperatures to adjust the boiling temperatures of the working fluids. In some embodiments, each self-contained on-component cooling loop may operate at fluid pressures independent of the fluid pressures of other self-contained on-component cooling loops on other server computers in the server rack.

The present disclosure relates to systems and methods for cooling heat-generating components of a computer or computing device according to at least the examples provided in the sections below:

[A1] In some embodiments, a method of thermal management of a computing device includes immersing a first electronic component of the computing device in a first working fluid contained in a first volume, immersing a second electronic component of the computing device in a second working fluid contained in a second volume, and changing a pressure in the first volume to alter a boiling temperature of the first working fluid in the first volume.

[A2] In some embodiments, changing the pressure in the first volume of [A1] includes changing a pump rate of a fluid pump.

[A3] In some embodiments, changing the pressure in the first volume of [A1] includes changing a flow rate through at least one valve.

[A4] In some embodiments, the method of [A1] further includes measuring a surface temperature of the first electronic component and changing the pressure in the first volume in response to the surface temperature.

[A5] In some embodiments, changing a pressure in the first volume to alter a boiling temperature of the first working fluid in the first volume of [A4] includes maintaining the boiling temperature within 5° C. of the surface temperature.

[A6] In some embodiments, changing a pressure in the first volume to alter a boiling temperature of the first working fluid in the first volume of [A4] includes maintaining the boiling temperature less than the surface temperature.

[A7] In some embodiments, the method of any of [A1] through [A6] further includes cooling the second electronic component with single phase immersion cooling.

[A8] In some embodiments, the method of any of [A1] through [A6] further includes cooling the second electronic component with two phase immersion cooling.

[B1] In some embodiments, a system for immersion cooling of a server computer includes an immersion tank, a server computer positioned in the immersion tank, a component tank positioned on a high-capacity component of the server computer, a first working fluid in the component tank, and a second working fluid in the immersion tank. The first working fluid contacts the high-capacity component in the component tank, and the second working fluid contacts a heat-generating component of the server computer outside of the component tank.

[B2] In some embodiments, the system of [B1] further comprises a component fluid pump configured to flow the first working fluid through the component tank.

[B3] In some embodiments, the component fluid pump of [B2] is configured to change the fluid pressure in the component tank.

[B4] In some embodiments, the system of [B1] further comprises an inlet valve on a component liquid return line, where the inlet valve adjusts a flowrate of the first working fluid to the component tank.

[B5] In some embodiments, the system of [B4] further comprises an outlet valve on a component vapor return line, the inlet valve configured to adjust a flowrate of the first working fluid from the component tank.

[B6] In some embodiments, the system of any of [B1] through [B5] further comprises a controller in data communication with one or more pressure control mechanisms configured to alter the fluid pressure in the component tank.

[B7] In some embodiments, the system of [B6] further includes a pressure sensor to measure a fluid pressure in the component tank, wherein the pressure sensor is in communication with the controller.

[B8] In some embodiments, the system of [B6] further includes a temperature sensor to measure an operating temperature of the component tank, wherein the temperature sensor is in communication with the controller.

[B9] In some embodiments, the controller of [B6] is configured to instruct the one or more pressure control mechanisms to change the fluid pressure in the component tank based at least partially upon a measurement from a sensor.

[B10] In some embodiments, the system of any of [B1] through [B9] includes at least one spray nozzle. The second working fluid is sprayed on the heat-generating component in droplets from the spray nozzle.

[C1] In some embodiments, a system for immersion cooling of a server computer includes an immersion tank, a first server computer positioned in the immersion tank, a second server computer positioned in the immersion tank, and a liquid working fluid in the immersion tank. The first server computer includes at least one first heat-generating component and at least one first high-capacity component, a first component tank positioned around the at least one first high-capacity component, and a first component working fluid positioned in the first component tank and contacting the at least one first high-capacity component. The first component working fluid has a first component fluid pressure. The second server computer includes at least one second heat-generating component and at least one second high-capacity component, a second component tank positioned around the at least one second high-capacity component, and a second component working fluid positioned in the second component tank and contacting the at least one second high-capacity component. The second component working fluid has a second component fluid pressure. The liquid working fluid positioned in the immersion tank contacts the first heat-generating components of the first server computer and the second heat-generating components of the second server computer. The liquid working fluid in the immersion tank has a fluid pressure different than the first component fluid pressure or the second component fluid pressure.

[C2] In some embodiments, the system of [C1] includes an inlet manifold and outlet manifold. The first component tank and second component tank are in fluid communication with the inlet manifold and outlet manifold.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method of thermal management of a computing device, the method comprising:
   immersing a first electronic component of the computing device in a first working fluid contained in a first volume;
   immersing a second electronic component of the computing device in a second working fluid contained in a second volume, wherein the first volume is contained within the second volume; and
   altering a boiling temperature of the first working fluid in the first volume based on changing a pressure in the first volume.

2. The method of claim 1, wherein changing the pressure in the first volume includes changing a pump rate of a fluid pump.

3. The method of claim 1, wherein changing the pressure in the first volume includes changing a flow rate through at least one valve.

4. The method of claim 1, further comprising measuring a surface temperature of the first electronic component, and changing the pressure in the first volume in response to the surface temperature.

5. The method of claim 4, wherein changing a pressure in the first volume to alter a boiling temperature of the first working fluid in the first volume includes maintaining the boiling temperature within 5° C. of the surface temperature.

6. The method of claim 4, wherein changing a pressure in the first volume to alter a boiling temperature of the first working fluid in the first volume includes maintaining the boiling temperature less than the surface temperature.

7. The method of claim 1, further comprising cooling the second electronic component with single phase immersion cooling.

8. The method of claim 1, further comprising cooling the second electronic component with two phase immersion cooling.

9. A system for immersion cooling of a server computer, the system comprising:
   an immersion tank;
   a server computer positioned in the immersion tank wherein the server computer includes at least one heat-generating component and at least one high-capacity component;
   a component tank positioned around the at least one high-capacity component;
   a first working fluid of a first type positioned in the component tank and contacting the high-capacity component, wherein the first working fluid has a first fluid pressure and a first boiling point; and
   a second working fluid of the first type positioned in the immersion tank and contacting the heat-generating component, wherein the second working fluid has a second fluid pressure different than the first fluid pressure and a second boiling point different than the first boiling point.

10. The system of claim 9, further comprising a component fluid pump configured to flow the first working fluid through the component tank.

11. The system of claim 10, wherein the component fluid pump is configured to change the first fluid pressure in the component tank.

12. The system of claim 9, further comprising an inlet valve on a component liquid return line, the inlet valve configured to adjust a flowrate of the first working fluid to the component tank.

13. The system of claim 12, further comprising an outlet valve on a component vapor return line, the inlet valve configured to adjust a flowrate of the first working fluid from the component tank.

14. The system of claim 9, further comprising a controller in data communication with one or more pressure control mechanisms configured to alter the first fluid pressure in the component tank.

15. The system of claim 14, further comprising a pressure sensor to measure the first fluid pressure in the component tank, wherein the pressure sensor is in communication with the controller.

16. The system of claim 14, further comprising a temperature sensor to measure an operating temperature of the component tank, wherein the temperature sensor is in communication with the controller.

17. The system of claim 14, wherein the controller is configured to instruct the one or more pressure control mechanisms to change the first fluid pressure in the component tank based at least partially upon a measurement from a sensor.

18. The system of claim 9, further comprising at least one spray nozzle, and wherein the second working fluid is sprayed on the heat-generating component in droplets from the spray nozzle.

19. A system for immersion cooling of a server computer, the system comprising:
   an immersion tank;
   a first server computer positioned in the immersion tank wherein the first server computer includes:
      at least one first heat-generating component and at least one first high-capacity component;
      a first component tank positioned around the at least one first high-capacity component; and
      a first component working fluid positioned in the first component tank and contacting the at least one first high-capacity component, wherein the first component working fluid has a first component fluid pressure and a first boiling point; and
   a second server computer positioned in the immersion tank wherein the second server computer includes:
      at least one second heat-generating component and at least one second high-capacity component;
      a second component tank positioned around the at least one second high-capacity component;
      a second component working fluid positioned in the second component tank and contacting the at least one second high-capacity component, wherein the second component working fluid has a second component fluid pressure and a second boiling point; and
   a liquid working fluid positioned in the immersion tank and contacting the first heat-generating components of the first server computer and the second heat-generating components of the second server computer, wherein the liquid working fluid has a fluid pressure different than the first component fluid pressure or the second component fluid pressure and wherein the liquid working fluid has a boiling point less than the first boiling point or the second boiling point.

20. The system of claim 19, further comprising an inlet manifold and outlet manifold, wherein the first component tank and second component tank are in fluid communication with the inlet manifold and outlet manifold.

* * * * *